(12) United States Patent
Humphrey

(10) Patent No.: US 12,066,612 B2
(45) Date of Patent: Aug. 20, 2024

(54) DYNAMIC CONCENTRATOR SYSTEM AND METHOD THEREFOR

(71) Applicant: PLX, Inc., Deer Park, NY (US)

(72) Inventor: Malcolm Humphrey, Hicksville, NY (US)

(73) Assignee: PLX, Inc., Deer Park, NY (US)

( * ) Notice: Subject to any disclaimer, the term of this patent is extended or adjusted under 35 U.S.C. 154(b) by 100 days.

(21) Appl. No.: 17/660,134

(22) Filed: Apr. 21, 2022

(65) Prior Publication Data

US 2022/0342193 A1 Oct. 27, 2022

Related U.S. Application Data

(60) Provisional application No. 63/178,737, filed on Apr. 23, 2021.

(51) Int. Cl.
*G02B 19/00* (2006.01)
*G02B 6/42* (2006.01)
*H01L 25/04* (2023.01)
*H01L 31/0304* (2006.01)
*H01L 31/107* (2006.01)

(52) U.S. Cl.
CPC ....... *G02B 19/0076* (2013.01); *G02B 6/4202* (2013.01); *G02B 6/422* (2013.01); *G02B 19/0009* (2013.01); *H01L 25/042* (2013.01); *H01L 31/03046* (2013.01); *H01L 31/107* (2013.01)

(58) Field of Classification Search
CPC .. G02B 19/0076; G02B 6/4202; G02B 6/422; G02B 19/0009; H01L 25/042; H01L 31/03046; H01L 31/107
See application file for complete search history.

(56) References Cited

U.S. PATENT DOCUMENTS 5,798,831 A * 8/1998 Hagiwara ............... G01N 21/94
356/237.2
6,423,956 B1 * 7/2002 Mandella ............... G02B 27/64
250/201.3
2014/0152972 A1 6/2014 Robertson et al.

FOREIGN PATENT DOCUMENTS

CN 102 192 706 9/2011
WO 2007/017641 2/2007
WO 2020/181031 9/2020

OTHER PUBLICATIONS

Extended European Search Report for EP 22169670.1, dated Oct. 25, 2022.

* cited by examiner

*Primary Examiner* — Georgia Y Epps
*Assistant Examiner* — Don J Williams
(74) *Attorney, Agent, or Firm* — ICE MILLER LLP; Safet Metjahic

(57) ABSTRACT

A dynamic concentrator system having a concentrator lens, a tracker platform and a receiver. In an embodiment, the concentrator lens is configured to receive an incoming light at an entrance angle α and concentrate the light beam on a focus spot. The tracker platform has a detector optical aperture and one or more actuators. The detector optical aperture can be configured to receive the concentrated light beam. The actuators can move the detector optical aperture in a spatial plane to a location of the focus spot. The receiver has a detector optically coupled to the detector optical aperture to receive the concentrated light beam from the detector optical aperture.

19 Claims, 8 Drawing Sheets

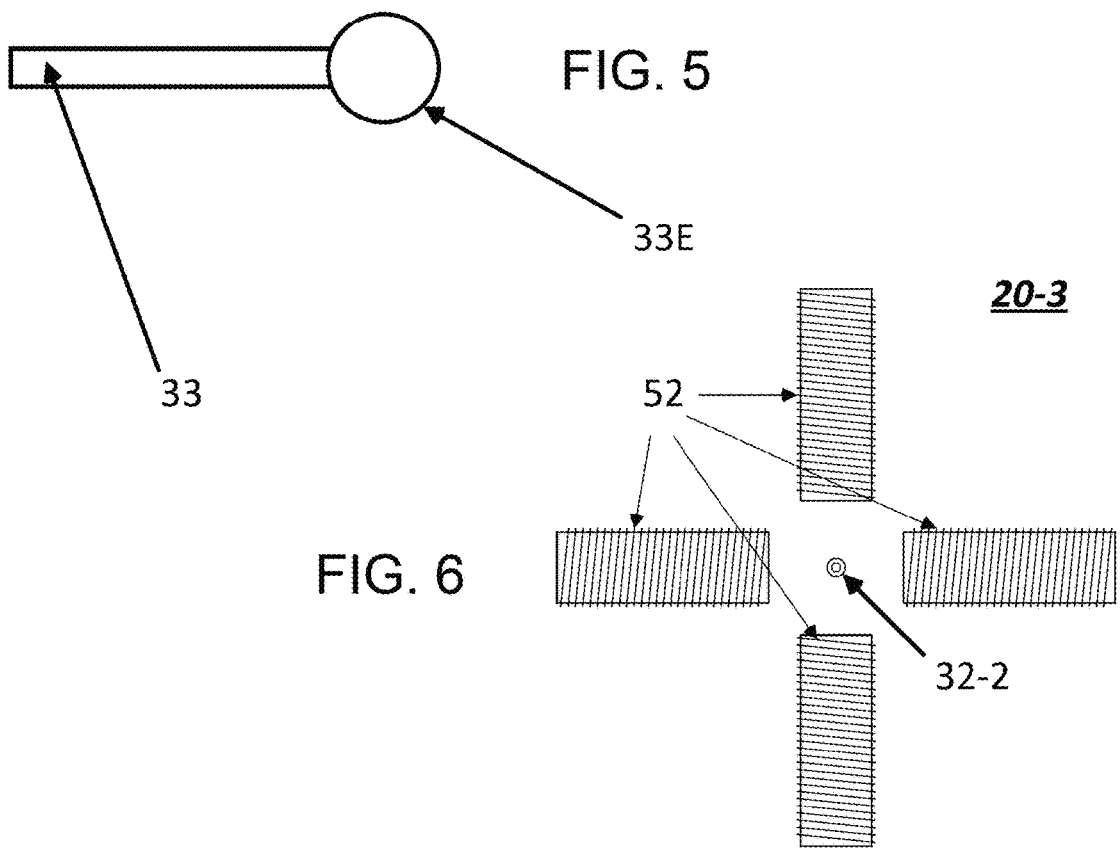
FIG. 5
FIG. 6
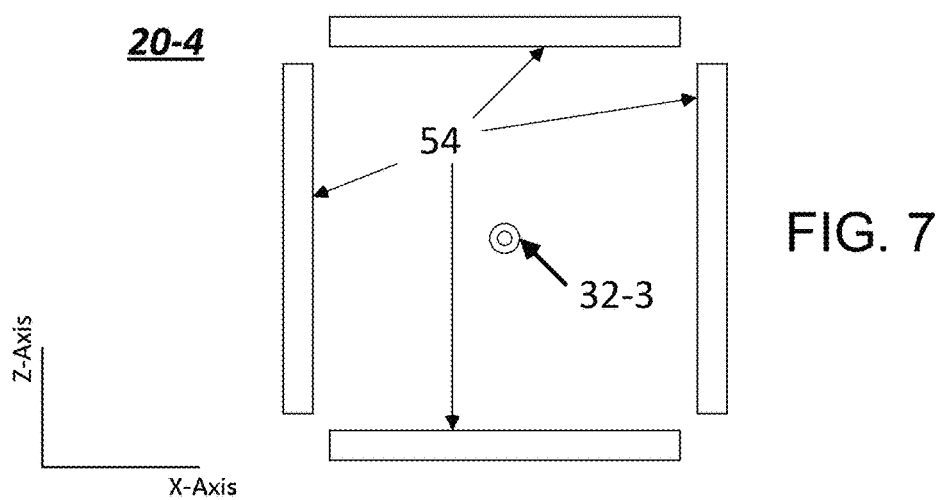
FIG. 7 under 35 U.S.C. § 119(e) to provisional U.S. patent application, Ser. No. 63/178,737, filed Apr. 23, 2021, titled, "Dynamic Concentrator," which is hereby incorporated herein in its entirety.

DYNAMIC CONCENTRATOR SYSTEM AND METHOD THEREFOR

CROSS REFERENCE TO RELATED APPLICATIONS

This application is entitled to and hereby claims priority under 35 U.S.C. § 119(e) to provisional U.S. patent application, Ser. No. 63/178,737, filed Apr. 23, 2021, titled, "Dynamic Concentrator," which is hereby incorporated herein in its entirety.

TECHNICAL FIELD

The present disclosure relates generally to laser technology and more particularly to systems, devices and methodologies related to, for example, laser beam steering, laser tracking and free-space communication, including optics, electronics, electronic firmware, and computer resources therefor.

BACKGROUND

Laser technologies are used in a broad range of applications, including, for example, communications, entertainment, industry, medicine, military, and research, among others. For instance, state-of-the-art rangefinders typically use laser technologies to target objects, measure distances to the objects and track the objects in real-time. State-of-the-art communications systems use lasers to transmit/receive information over long distances at data rates exceeding ten to one-hundred times, or more, possible using radio frequency (RF) systems.

Current laser technologies are capable of emitting highly coherent light that can be focused on a small spot over a great distance. However, even with the most coherent, collimated light beam lasers, the laser beam spreads out over long distances, thereby necessitating a concentrator lens to focus the beam onto a detector.

SUMMARY

The present disclosure provides a technological solution that includes embodiments of a methodology, system, apparatus and computer program that overcome limitations of current laser technologies, including limitations related to concentrator lenses and lens systems when receiving and focusing a laser beam to a concentration spot on an active area of a detector. In an embodiment, a dynamic concentrator system is provided that comprises a concentrator lens configured to receive an incoming light at an entrance angle α and concentrate the light beam on a focus spot; a tracker platform having a detector optical aperture and one or more actuators, the detector optical aperture being configured to receive the concentrated light beam and a pair of actuators being configured to move the detector optical aperture in a spatial plane to a location of the focus spot; and a receiver having a detector optically coupled to the detector optical aperture and configured to receive the concentrated light beam from the detector optical aperture. The detector optical aperture can comprise a fiber collimator. The fiber collimator can include a multicore collimator. The tracker platform can comprise a plurality of guide rods, a plurality of guides and a pair of drive sleeves configured to move the fiber collimator to the location of the focus spot. The receiver can comprise a fiberoptic line configured to optically couple the fiber collimator to the detector.

In the dynamic concentrator system: the detector can comprise an Indium Gallium Arsenide (InGaAs) Avalanche Photodiode (APD) detector; the tracker platform can comprise a tracking stage, and wherein the detector optical aperture is affixed to the tracking stage; each of the pair of drive sleeves can be connected directly or indirectly to the tracking stage at an end and one of the pair of actuators at another end; the fiber collimator can be affixed to an end of the fiberoptic line; or the fiber collimator can be a bare end of the fiberoptic line.

In an embodiment, the dynamic concentrator system can comprise: a concentrator lens configured to receive an incoming light at an entrance angle α and concentrate the light beam on a focus spot; a tracker platform having a detector optical aperture and one or more actuators, the detector optical aperture being configured to receive the concentrated light beam and the one or more actuators being configured to move the detector optical aperture to a center location of the focus spot; and a receiver having a detector optically coupled to the detector optical aperture and configured to receive the concentrated light beam from the detector optical aperture. The detector optical aperture can include a fiber collimator. The receiver can include a fiberoptic line connected between and arranged to optically couple the detector optical aperture to the detector. The detector can include an Indium Gallium Arsenide (InGaAs) Avalanche Photodiode (APD) detector. The tracker platform can include a tracking stage, and wherein the detector optical aperture is affixed to the tracking stage. The tracker platform can include a guide rod and a drive sleeve configured to travel along a portion of a length of the guide rod, and wherein the drive sleeve is connected directly or indirectly to the tracking stage and configured to engage one of the one or more actuators to move the tracking stage along a first axis. The tracker platform can include a second guide rod and a second drive sleeve configured to travel along a portion of a length of the second guide rod, and wherein the second drive sleeve is connected directly or indirectly to the tracking sage and configured to engage another one of the one or more actuators to move the tracking stage along a second axis that is orthogonal to the first axis. The drive sleeve can be connected to the tracking stage by a stage arm. The one or more actuators can include an electromagnetic coil. The one or more actuators can include a charged plate.

In an embodiment, the dynamic concentrator system can comprise a tracker platform equipped with a detector optical aperture and a plurality of actuators, the detector optical aperture being configured to receive a concentrated light beam from a concentration lens system and the plurality of actuators being configured to move the detector optical aperture to a location corresponding to a focus spot of the concentrated light beam; a receiver having a detector optically coupled to the detector optical aperture and configured to receive the concentrated light beam from the detector optical aperture; and a controller configured to determine a position of the focus spot and drive the plurality of actuators to move the detector optical aperture to the position of the focus spot. The detector optical aperture can include a fiber collimator. The fiber collimator can include a multicore collimator. The receiver can include a fiberoptic line connected between and arranged to optically couple the detector optical aperture to the detector. The detector can include an Indium Gallium Arsenide (InGaAs) Avalanche Photodiode (APD) detector.

Additional features, advantages, and embodiments of the disclosure may be set forth or apparent from consideration of the detailed description and drawings. Moreover, it is to be understood that the foregoing summary of the disclosure and the following detailed description and drawings provide non-limiting examples that are intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced.

FIG. 5 depicts a partial view of an embodiment of a fiber collimator.

FIG. 6 depicts an embodiment of an electromagnetic actuator that can be included in a dynamic concentrator system constructed according to the principles of the disclosure.

FIG. 7 depicts an embodiment of an electrostatic actuator that can be included in a dynamic concentrator system constructed according to the principles of the disclosure.

Figure 1C:
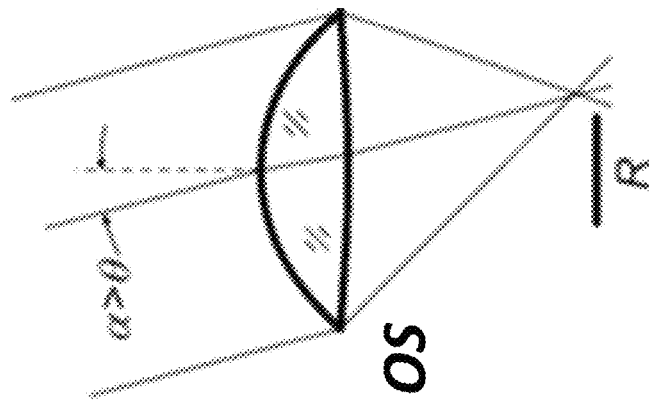
FIGS. 1A-1C depict examples of Etendue properties of a light in an optical system at different acceptance angles.

The present disclosure is further described in the detailed description that follows.

DETAILED DESCRIPTION

The disclosure and its various features and advantageous details are explained more fully with reference to the non-limiting embodiments and examples that are described or illustrated in the accompanying drawings and detailed in the following description. It should be noted that features illustrated in the drawings are not necessarily drawn to scale, and features of one embodiment can be employed with other embodiments as those skilled in the art would recognize, even if not explicitly stated. Descriptions of well-known components and processing techniques may be omitted so as to not unnecessarily obscure the embodiments of the disclosure. The examples are intended merely to facilitate an understanding of ways in which the disclosure can be practiced and to further enable those skilled in the art to practice the embodiments of the disclosure. Accordingly, the examples and embodiments should not be construed as limiting the scope of the disclosure. Moreover, it is noted that like reference numerals represent similar parts throughout the several views of the drawings.

Figure 1B:
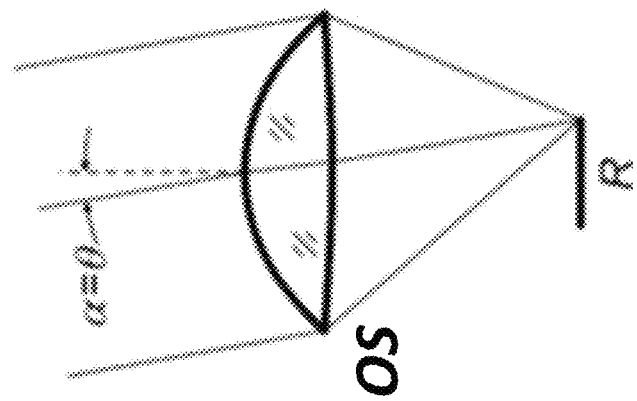
Figure 1A:
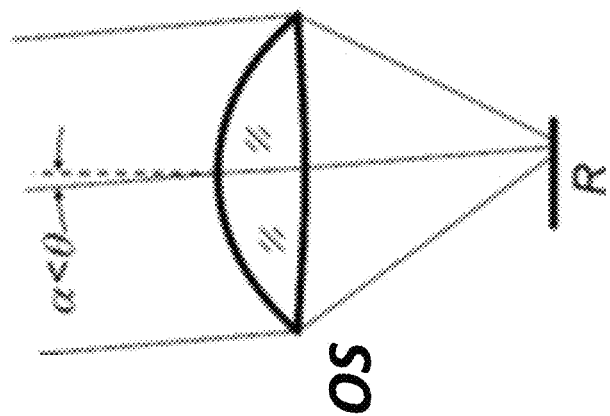

FIGS. 1A-1C depict three illustrative examples of the Etendue principle for a collimated light beam concentrated and focused by an optical system OS to a concentration spot on an active area of a receiver R. The principle of Etendue is that for a concentration ratio C of the optical system OS, there is a limit in acceptance angle θ as the focus spot moves with incoming angle α of the light, as seen in the three examples in FIGS. 1A, 1B, and 1C, namely, α<θ, α=θ, and α>θ, respectively. The terms "concentration spot" and "focus spot" are used interchangeably by this disclosure. For the optical system OS, the maximum concentration ratio ($C_{MAX}$) for a given acceptance angle θ and concentrator refractive index n is given by the equation:

$$C_{MAX}=n/\sin \theta$$

While the receiver R can be increased in active area to compensate for the Etendue effect, this will be at the expense of increased capacitance and increased pulse rise/fall times, all of which are highly undesirable in implementations that require minimal noise or fast response times, such as, for example, in LiDAR, laser tracking and laser communications systems.

The disclosure provides a technological solution that addresses and overcomes these and other limitations in optical systems, including limitations due to Etendue effect. The technological solution includes, in various embodiments, a methodology, system, apparatus and computer program that can move a detector optical aperture (such as, for example, a fiber collimator, discussed below) or the receiver R to follow the focus spot as an incoming light beam enters the concentrator lens at different angles.

In various embodiments, a fiberoptic coupled detector can be included, having a fiberoptic line connected at one end to the detector and a fiber collimator at the other end of the fiberoptic line. The fiber collimator can be moved in synchronization with the focus spot, thereby minimizing the mass of the moving parts and providing a fast response time. In an embodiment, the fiber collimator can include a multicore collimator.

The disclosed technological solution can be included in light beam-based applications where structural simplicity, small footprint size, light weight, or fast response times are necessary or desirable, such as, for example, in light detection and ranging (LiDAR) systems, tracking laser range finders (T-LRF), and laser free space communications. The disclosed technology solution can achieve long range performance by concentrating light from a large area onto a small active area of a receiver R and synchronizing the position of the active area in real-time with the position of the moving concentration spot, even with substantial deviations in the incoming angle α of the received light beam.

Figure 2:
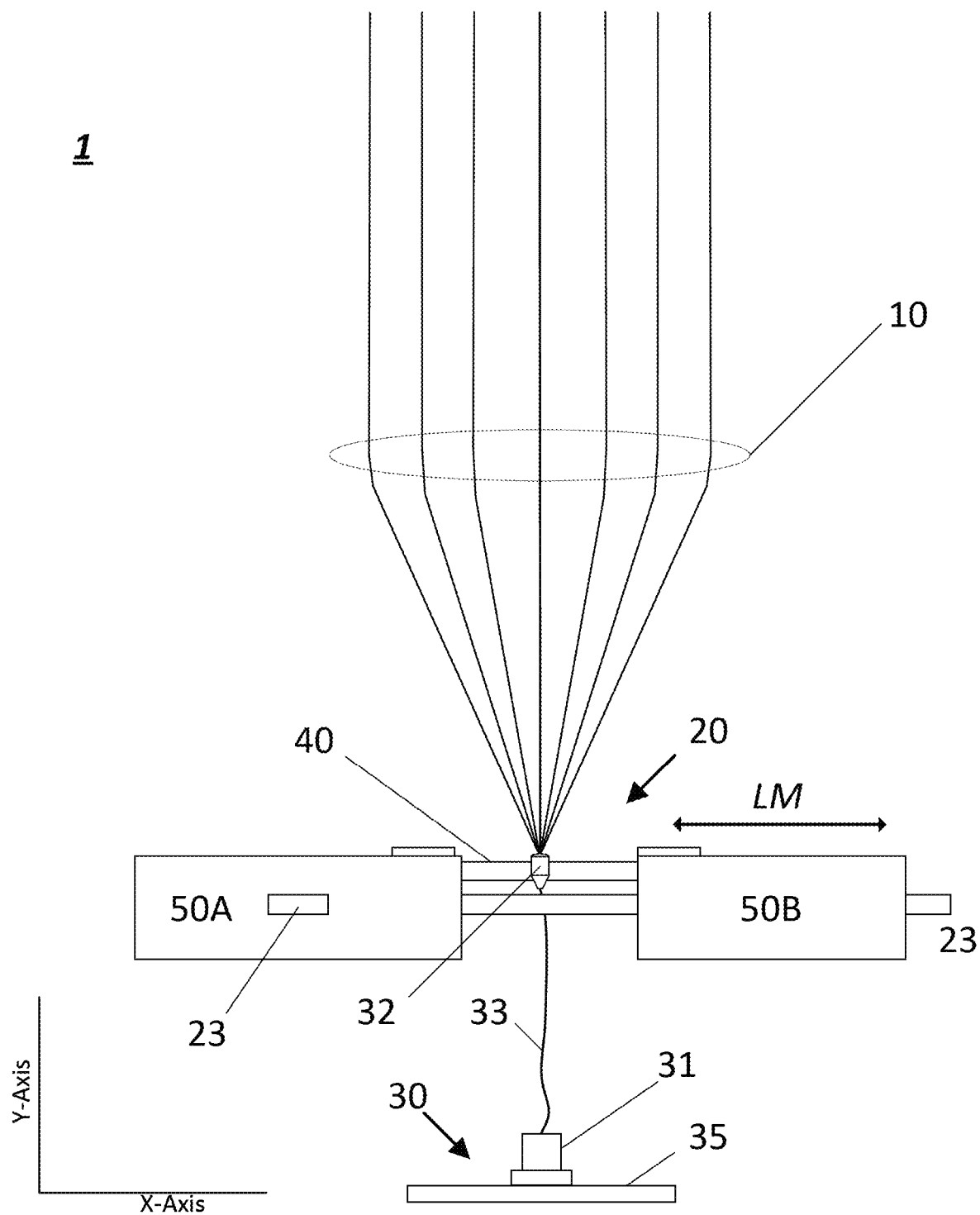
FIG. 2 depicts a first view of an embodiment of a dynamic concentrator system.
Figure 3:
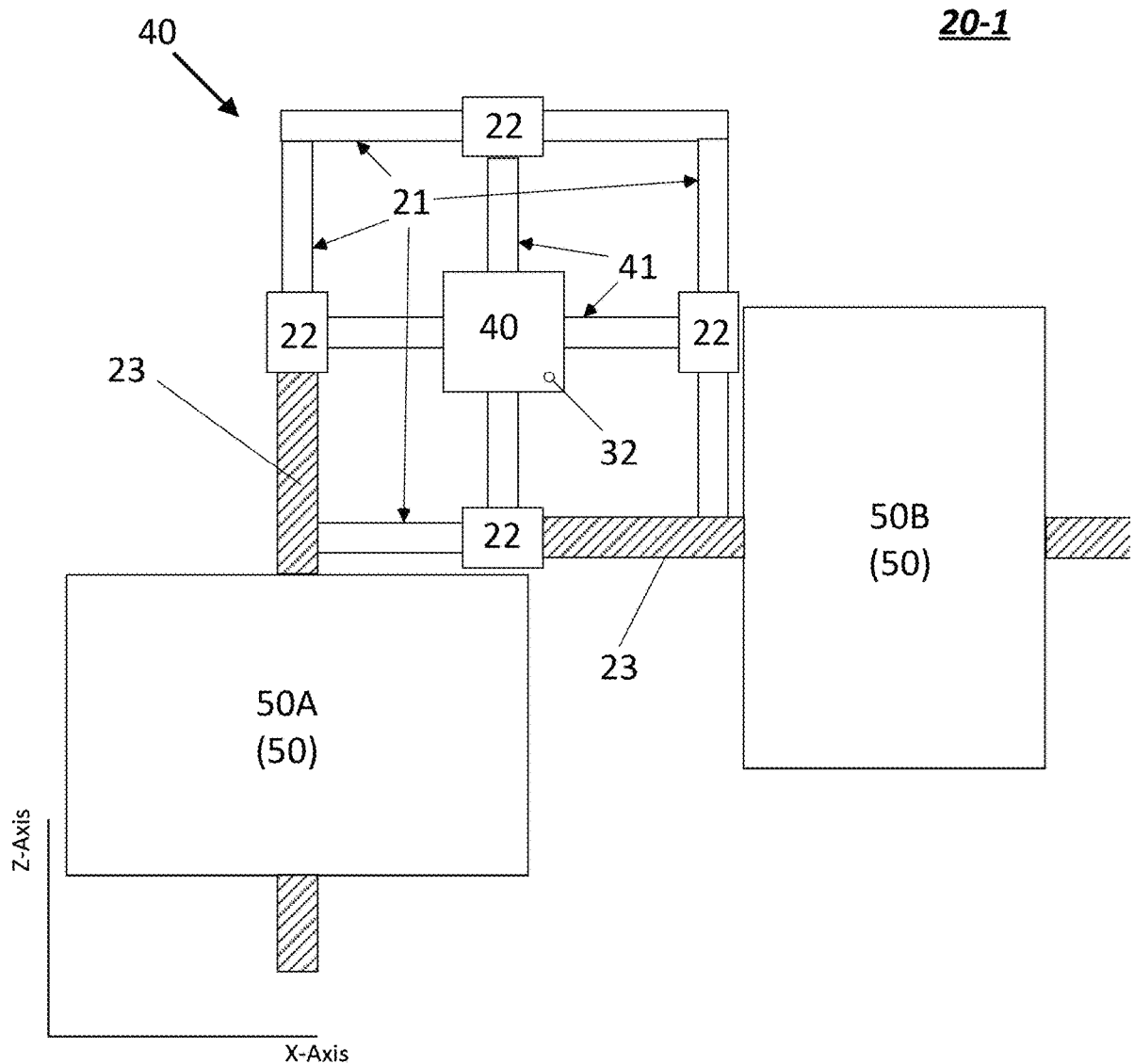
FIG. 3 depicts a second view orthogonal to the first view of the embodiment of the dynamic concentrator system depicted in FIG. 2.

FIGS. 2 and 3 depict a first view and a second view of an embodiment of a dynamic concentrator (DC) system 1, with the second view being orthogonal to the first view. In the depicted embodiment, the DC system 1 includes an incoming concentration lens system 10, a light-tracker (LT) platform 20-1, and a light receiver 30. The concentration lens system 10 can include a concentration lens or a plurality of optical components, including one or more lenses, arranged to concentrate and focus an incoming light beam on a focus spot 11 (for example, shown in FIGS. 9A, 9B) on an active area of the light receiver 30.

The LT platform 20-1 can include one or more guide rods 21, one or more guides 22, one or more drive slides 23, a tracker stage 40, and one or more actuators 50. In various embodiments, the guides 22 can include a frictionless or low friction linear bearing, a linear sleeve bearing, a linear ball bearing, an open linear bearing, or a closed linear bearing that can travel along a length of a guide rod 21.

In various embodiments, the drive sleeve 23 can include (for example, internally) one or more frictionless or low friction linear bearings, linear drive shafts, linear sleeve bearings, or linear ball bearings that can travel along a length of the guide rod 21. In an embodiment, the drive sleeve 23 can include, or it can be affixed to, a guide 22 (as seen in the embodiment depicted in FIGS. 2 and 3), which in turn can include or can be affixed to a stage arm 41. The drive sleeve 23 can include (for example, externally) a portion, a surface or a structure (not shown) that can engage and be driven by the linear actuator 50 to move the drive sleeve 23 along a length of the guide rod 21 (for example, along its longitudinal axis) and with it the stage arm 41.

The tracker stage 40 can include one or more stage arms 41 or, in certain embodiments, the tracker stage 40 can be affixed to the one or more stage arms 41. In an embodiment, each stage arm 41 can be affixed to or include the guide 22 such that it can travel along the guide rod 21.

In an embodiment, the tracker stage 40 can include lightweight fiber platform with bearings.

The LT platform 20-1, including the tracker stage 40, and actuator 50 can be configured to provide two-dimensional spatial movement of the tracker stage 40. In certain embodiments, the tracker stage 40 and actuator 50 can be configured to provide three-dimensional spatial movement of the tracker stage 40. In the embodiment depicted in FIGS. 2 and 3, an x-axis drive sleeve 23 can be driven by the actuator 50B and the z-axis drive sleeve 23 can be driven by the actuator 50B to move the tracker stage 40 anywhere within, and to any point in, the x-z plane with the range of motions of the drive sleeves 23 along their respective guide rods 21. Each of the actuators 50A, 50B can be controlled by, for example, a dynamic concentrator system (DCS) controller 60 (example shown in FIG. 10) to move, steer and position the fiber collimator 32 in synchronization with the focus spot 11 (shown in FIGS. 9A and 9B) such that the focus spot 11 is, for example, centered on the fiber collimator 32 at substantially all times. In an embodiment, the fiber collimator 32 can include a multicore collimator 32M (shown in FIG. 8).

The actuator 50 can include a pair of linear actuators 50A, 50B, each of which can be configured to drive a sleeve 23 and, thereby, the tracker stage 40 along, for example, the z-axis or x-axis, respectively. The actuators 50A, 50B can include piezoelectric linear actuators, electromagnetic motors, electrostatic actuators, linear motors, linear maglev motors, or ultrasonic levitation motors to control movement and position the tracking stage 40 or, in certain embodiments, a fiber collimator 32.

The light receiver 30 can include a detector 31 and a support 35. The support 35 can include, for example, a circuit board or another structure that can securely hold the detector 31. The detector 31 can include an Indium Gallium Arsenide (InGaAs) Avalanche Photodiode (APD) detector or array, a photodiode, a photomultiplier, or a Single Photon Avalanche Detector (SPAD). In the embodiment depicted in FIG. 2, the light receiver 30 can include a fiber collimator 32 and a fiberoptic line 33 that collimates and directs the collimated light beam to an active area on the detector 31. The fiber collimator 32 can be affixed to and supported by the tracker stage 40, as seen in FIG. 2. The fiber collimator 32 can be moved with the tracker stage 40 in synchronization with the concentration spot, thereby minimizing the mass of the moving parts and providing a fast response time.

In an alternative embodiment, the detector 31 can be included on the tracker stage 40, in which case the fiberoptic line 33 need not be included.

Figure 8:
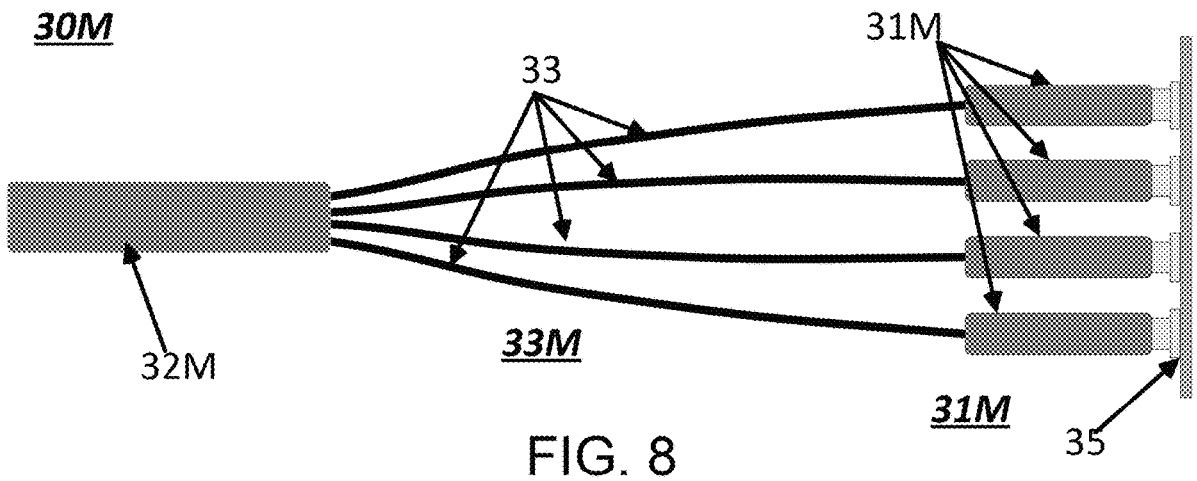
FIG. 8 depicts an embodiment of a multicore receiver constructed according to the principles of the disclosure.

In an embodiment, the light receiver 30 can include the multicore receiver 30M (shown in FIG. 8).

In various embodiments, the fiber collimator 32 can be implemented without a tracker stage 40, such as, for example, the embodiments depicted in FIGS. 6 and 7.

Figure 4:
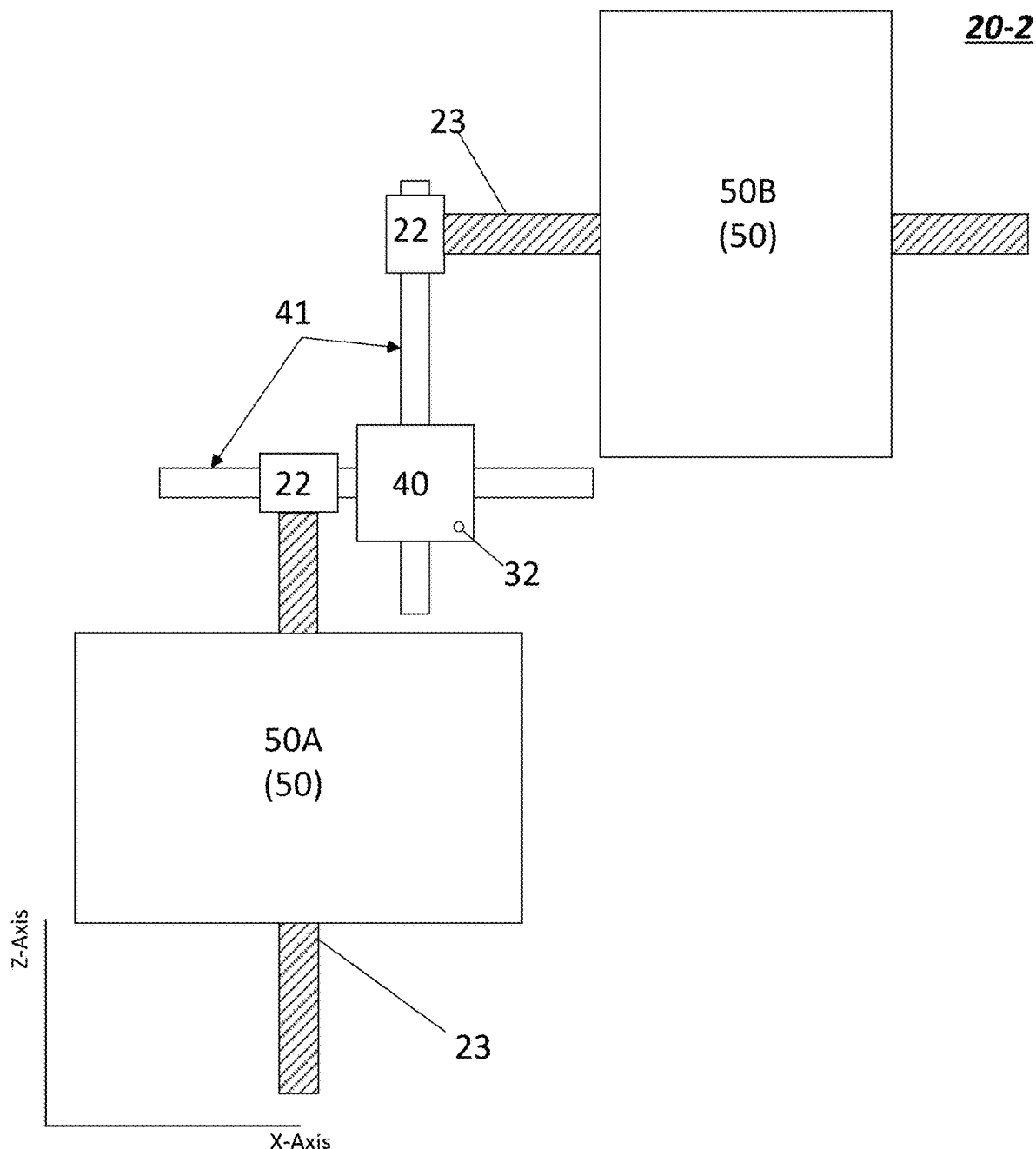
FIG. 4 depicts an embodiment of a tracker platform, including the tracker stage and a pair of actuators.

FIG. 4 depicts another embodiment of an LT platform 20-2, including the tracker stage 40 and actuators 50A, 50B. In this embodiment, the x-axis and y-axis drive sleeves 23 can each be affixed to a guide 22, which in turn can be slidably supported by and travel along the longitudinal of a respective stage arm 41, as seen in the depiction. The stage arms 41 can be immovably fixed to or formed as part of the tracker stage 40. The stage arm 41 can include a guide rod 21.

FIG. 5 shows a view an embodiment of the fiber collimator 32. In this embodiment, the fiber collimator 32 can include an end portion of the fiberoptic line 33, which can include the bare fiber or have a lens 33E bonded to the fiberoptic line 33 to collimate light into the fiberoptic line 33.

FIG. 6 depicts another embodiment of a light tracker platform, the LT platform 20-3. The LT platform 20-3 includes a plurality of electromagnetic coils 52 that are configured to steer a fiber collimator 32-2. In the embodiment, the fiber collimator 32-2 can include a small magnet affixed to the fiber collimator 32, or the fiber collimator 32 magnetized to respond to the electromagnetic forces generated by the electromagnetic coils 52. Each of the electromagnetic coils 52 can be powered under control of, for example, the dynamic concentrator system (DCS) controller 60 (example shown in FIG. 10) to move, steer and position the fiber collimator 32 in synchronization with the concentration spot.

FIG. 7 depicts yet another embodiment of the light tracker platform, the LT platform 20-4. The LT platform 20-4 includes a plurality of charged plates 54 and a fiber collimator 32-3. The fiber collimator 32-3 can include the fiber collimator 32 with a metal coating, which can be charged or grounded. Each of the plates 54 can be charged under control of, for example, the dynamic concentrator system (DCS) controller 60 (example shown in FIG. 10) to move, steer and position the fiber collimator 32 in synchronization with the concentration spot.

Figure 9A:
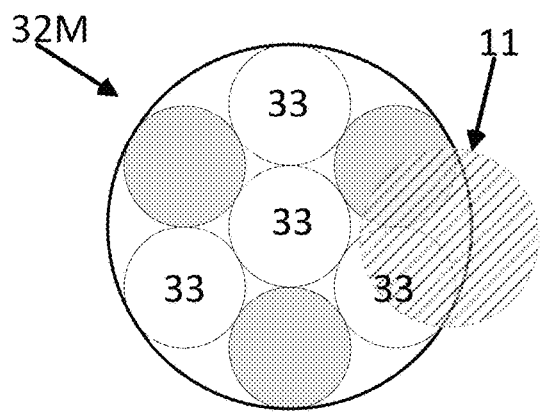
FIGS. 9A and 9B depict a sectional view of an embodiment of a multicore collimator constructed according to the principles of the disclosure.
Figure 9B:
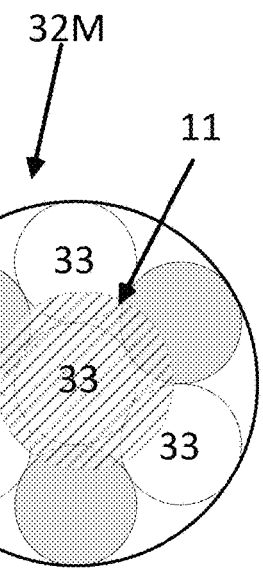

In an embodiment, the LT platform can include an acoustic levitation driving mechanism (not shown), by which acoustic radiation pressure can be generated and controlled to move, steer, and center the fiber collimator 32 with respect to the focus spot 11 (shown in FIGS. 9A and 9B).

FIG. 8 depicts an embodiment of a receiver 30M having a multidetector 31M optically coupled through a multicore fiber 33M to a multicore collimator 32M. In an embodiment, the multidetector 31M includes four separate detectors 31, each of which can be configured to supply a signal that provides directional feedback to the electronics indicative of the position of the focus spot 11 (for example, DCS controller 60, shown in FIG. 10). The multicore fiber 33M can include four fiberoptic lines 33, each of which can be optically coupled at an end to a respect one of the detectors 31. The other end of each fiberoptic line 33 can be optically coupled or or included in the multicore collimator 32M. It is noted that fewer or more than four detectors 31 or fiberoptic lines 33 can be included in various embodiments.

In an embodiment, the multicore collimator 32M can include four active fibers in a bundle, as seen in the embodiment depicted in FIGS. 9A and 9B.

FIGS. 9A and 9B depict a sectional view of an embodiment of the multicore collimator 32M, with a focus spot off center and centered on a multicore collimator 32M, respectively. In this embodiment, the multicore collimator 32M has four active fibers 33 and three dummy fibers, which are depicted in grey. The dummy fibers can be included for ease of construction. In an embodiment, all of the fibers are fused together.

As seen by moving from FIG. 9A to FIG. 9B, the focus spot 11 can be focused onto the center of the multicore collimator 32M. This can be done as discussed above with respect to the embodiments comprising the fiber collimator 32. When light is focused on the multicore collimator 32M, it will overlap multiple fibers. This gives the system directional feedback that can be used to determine where the focus spot 11 is in relation the center fiber and facilitate movement of the tracker stage 40 to center the multicore collimator 32M with relation to the focus spot 11.

In an embodiment, the multicore collimator 32M can have a diameter of about 360 micrometers (μm). In various embodiment the multicore collimator 32M can have a diameter less or greater than 360 μm.

Figure 10:
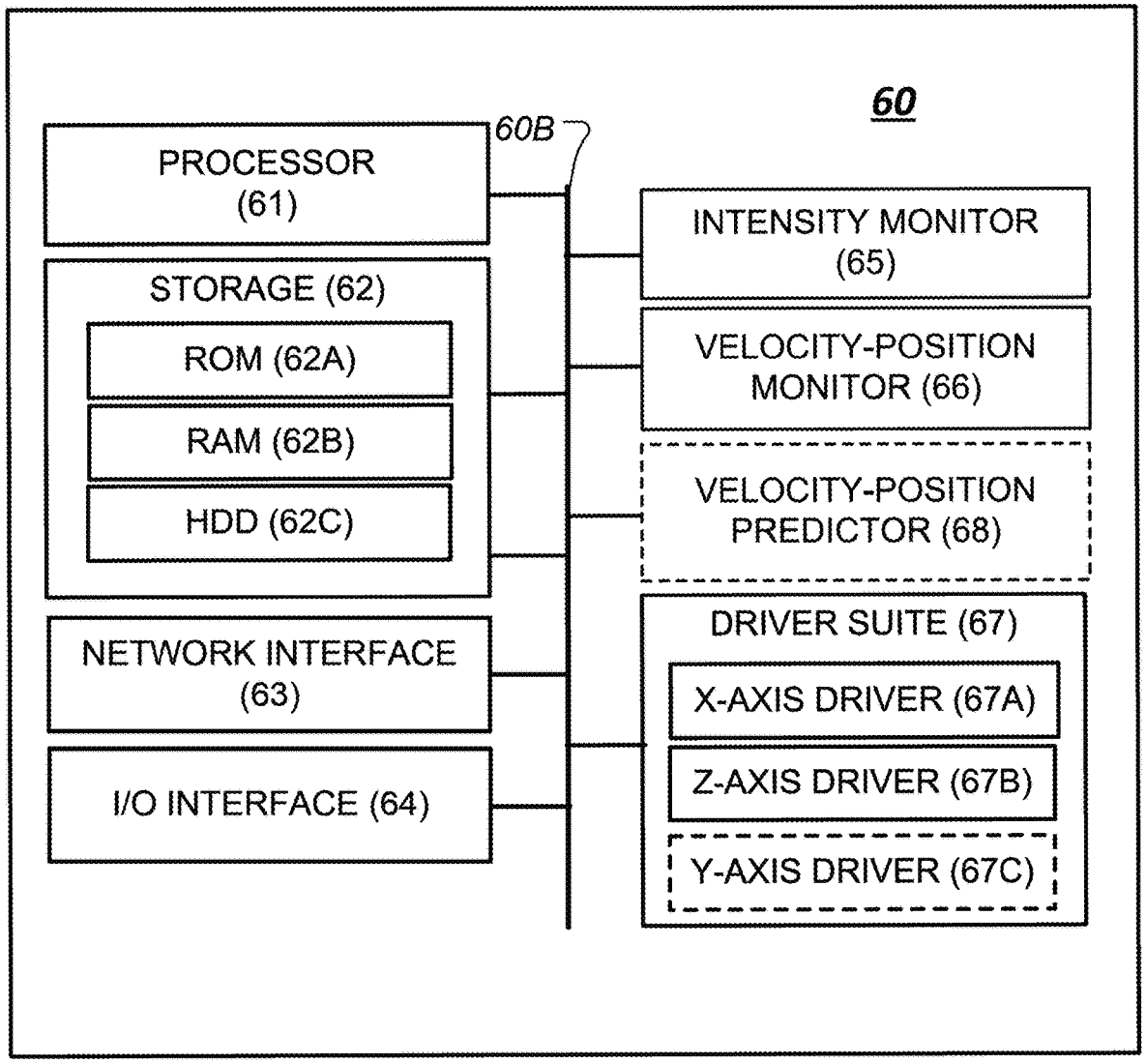
FIG. 10 depicts an embodiment of a dynamic concentrator system controller constructed according to the principles of the disclosure.

FIG. 10 depicts an embodiment of a dynamic concentrator system (DCS) controller 60, according to the principles of the disclosure. The DCS controller 60 can be implemented with any of the embodiments of the disclosed dynamic concentrator system, including the embodiments disclosed herein. The DCS controller 60 can include a bus 60B, a processor 61, a storage 62, a network interface 63, an input-output (IO) interface 64, an intensity monitor 65, a velocity-position determiner 66 and a driver suite 67. The DCS controller 60 can, optionally, include a velocity-position predictor 68. Any one or more of the intensity monitor 65, velocity-position determiner 66, driver suite 67, or the velocity-position predictor 68 can be included as a computing device or a computer resource. Any of the components in the DCS controller 60 can be communicatively coupled to the bus 60B and/or can be mounted on a common motherboard or in another manner, as appropriate.

The processor 61 can be arranged to process instructions for execution within the DCS controller 60, including instructions stored in the memory 62. The processor 61 can be arranged to execute computer programming code or instructions to perform the methodologies disclosed herein, including the process 100 depicted in FIG. 11. The processor 61 can include a computing device. The processor 61 can be arranged to interact with any of the components in the DCS controller 60 to carry out or facilitate the processes disclosed herein.

The bus 60B can include any of several types of bus structures that can further interconnect to a memory bus (with or without a memory controller), a peripheral bus, and a local bus using any of a variety of commercially available bus architectures.

The memory 62 can include a read-only memory (ROM) 62A, a random-access memory (RAM) 62B, or a hard disk drive (HDD) 62C. The memory 62 can provide nonvolatile storage of data, data structures, and computer-executable instructions, and can accommodate the storage of any data or computer resources in a suitable digital format. The memory 62 can include a non-transitory computer-readable medium that can hold executable or interpretable computer code (or instructions) that, when executed by the processor 61, cause the DCS controller 60 perform the processes provided by this disclosure. The computer-readable medium can be contained in the memory 62, and can include sections of computer code that, when executed by the processor 61, cause the driver suite 67 to operate and control, for example, the actuators 50A, 50B, 52, or 54 (shown in FIGS. 2-4 and 6-7) to move, steer and center the fiber collimator 32 in synchronization with the concentration spot.

A basic input-output system (BIOS) can be stored in the ROM 62A, which can include, for example, a non-volatile memory, an erasable programmable read-only memory (EPROM), or an electrically erasable programmable read-only memory (EEPROM). The BIOS can contain the basic routines that help to transfer information between any one or more of the components in the DCS controller 60, such as during start-up.

The RAM 62B can include dynamic random-access memory (DRAM), a synchronous dynamic random-access memory (SDRAM), a static random-access memory (SRAM), a nonvolatile random-access memory (NVRAM), or another high-speed RAM for caching data.

The HDD 62C can include any suitable hard disk drive. The HDD 62C can include a solid-state drive (SSD).

The DCS controller 60 can include a machine learning (ML) platform. In an embodiment, the ML platform can be located in the velocity-position predictor 66. In various embodiments, an ML model can be stored in the memory 62 and executable commands carried out by the processor 61 to perform the processes disclosed herein.

In various embodiments, the ML platform can include, for example, an artificial neural network (ANN), a convolutional neural network (CNN), a deep convolutional neural network (DCNN), region-based convolutional neural network (R-CNN), a Mask-RCNN, a deep convolutional encoder-decoder (DCED), a recurrent neural network (RNN), a neural Turing machine (NTM), a differential neural computer (DNC), a support vector machine (SVM), a deep learning neural network (DLNN), Naive Bayes, decision trees, logistic model tree induction (LMT), NBTree classifier, case-based, linear regression, Q-learning, temporal difference (TD), deep adversarial networks, fuzzy logic, K-nearest neighbor, clustering, random forest, rough set, or any other machine intelligence platform capable of supervised or unsupervised learning for detecting, monitoring and predicting a light intensity, focus spot motion and focus spot position.

The memory 62 can be configured to store ML training datasets and ML testing datasets for building and training an ML model. The ML model can be stored in the memory 62. In an embodiment, the ML platform that can be configured to build and train the ML model to perform the operations disclosed herein. The ML model can be trained to detect, analyze and predict an incoming intensity level, an incoming light distribution profile, a focus spot velocity and a focus spot position. The ML model can be configured to interact with the driver suite 67 and cause the DCS controller 60 to operate the LT platform 20, for example, to center focus spot on the fiber collimator 32.

In an embodiment, the ML model can be trained to detect, analyze and predict an intensity profile of a Gaussian beam, including the peak amplitude and light distribution profile. In an embodiment, the intensity level can include the intensity level of the light in the focus spot (for example, in units of lux). The velocity can include the speed and direction of motion of the focus spot in, for example, x-y-z-axis coordinate system.

In an embodiment, the ML model can be loaded, for example, to the RAM 62B and run by the processor 61 executing computer resource processes on the ML platform. The training datasets can be updated periodically or continuously with updated parametric values, such as, for example, during parametric tuning of the ML model.

A computer program product can be tangibly embodied in the non-transitory computer-readable medium, which can be contained in the memory 62. The computer program product can contain instructions that, when executed, perform one or more methods or operations, such as those included in this disclosure.

Any number of computer resources can be stored in the memory 62, including, for example, a program module, an operating system, an application program, an application program interface (API), or program data. The computing resource can include an API such as, for example, a remote procedure call (RPC) API, a representation state transfer (REST) API, or any other utility or service API. Any (or all) of the operating system, application programs, APIs, program modules, and program data can be cached in the RAM 62B as executable sections of computer code.

The network interface 63 can be configured to connect to and communicate via a network (not shown). The network interface 63 can include a wired or a wireless communication network interface (not shown) or a modem (not shown). When used in a local area network (LAN), the network interface 63 can be connected to the LAN network through the wired or wireless communication network interface; and, when used in a wide area network (WAN), the network interface 63 can be connected to the WAN network through a modem. The modem (not shown) can be connected to the bus 60B. The network interface 63 can include a receiver (not shown) and a transmitter (not shown).

The IO interface 64 can receive commands or data from an operator via a user interface (not shown), such as, for example, a keyboard (not shown), a mouse (not shown), a pointer (not shown), a stylus (not shown), a microphone (not shown), a speaker (not shown), or a display device (not shown). The received commands and data can be forwarded from the IO interface 64 as instruction to data signals, via the bus 60B, to any of the computer resource assets in the DCS controller 60.

The intensity monitor 65 can be configured to receive a beam sensor signal, for example, from the receiver 30, or multiple beam sensor signals as in the embodiment of the receiver 30M depicted in FIGS. 8, 9A and 9B. The intensity monitor 65 can be configured to determine the peak intensity value or a light intensity distribution for the focus spot 11 based on the beam sensor signal(s). The intensity monitor 65 can be configured to interact with the velocity-position monitor 66, which in turn can be configured to determine position values for the intensity distribution profile of the focus spot 11, including the location of the peak intensity value.

The velocity-position monitor 66 can be configured to interact with the driver suite 67, which in turn can be configured to operate and drive one or more actuators in the light tracker platform, including, for example, actuators 50A, 50B, 52, and 54 (shown in FIGS. 2-4, 6-7). The driver suite 67 can include an x-axis driver 67A, which can be configured to drive, for example, the actuator 50B (shown in FIG. 3), and a z-axis driver 67B, which can be configured to drive, for example, the actuator 50A (shown in FIG. 3). In certain embodiments that include three-dimensional spatial movement of the fiber collimator 32 (or receiver 30), the driver suite 67 can include a y-axis driver 67C, which can be configured to drive a third actuator (not shown) in a plane orthogonal to the x-z plane.

In an embodiment, the intensity monitor 65, the velocity-position monitor 66, and the driver suite 67 can be configured to interact with each other and operate the LT platform 20 (for example, 20-1, 20-2, 20-3, 20-4) to search for and detect the focus spot 11 in the x-z plane. The search can be performed, for example, by moving the fiber collimator 32 (or multicore collimator 32M, or receiver 30 or receiver 30M) according to a predetermined search pattern until the focus spot 11 is detected.

The optional velocity-position predictor 68 can be configured to operate an ML platform to learn the behavior of the incoming light beam over time for a given application and accurately predict the light intensity value, light distribution profile and position of the focus spot 11 at a future time. The velocity-position predictor 68 can be configured to interact with the driver suite 67 to preemptively locate the fiber collimator 32 (or multicore collimator 32M, or receiver 30, or receiver 30M) to a position at which the center of the focus spot 11 is predicted to occur. The velocity-position predictor 68 can be configured to provide a prediction score that represents an estimated likelihood that the focus spot 11 center will appear at a predicted location.

Figure 11:
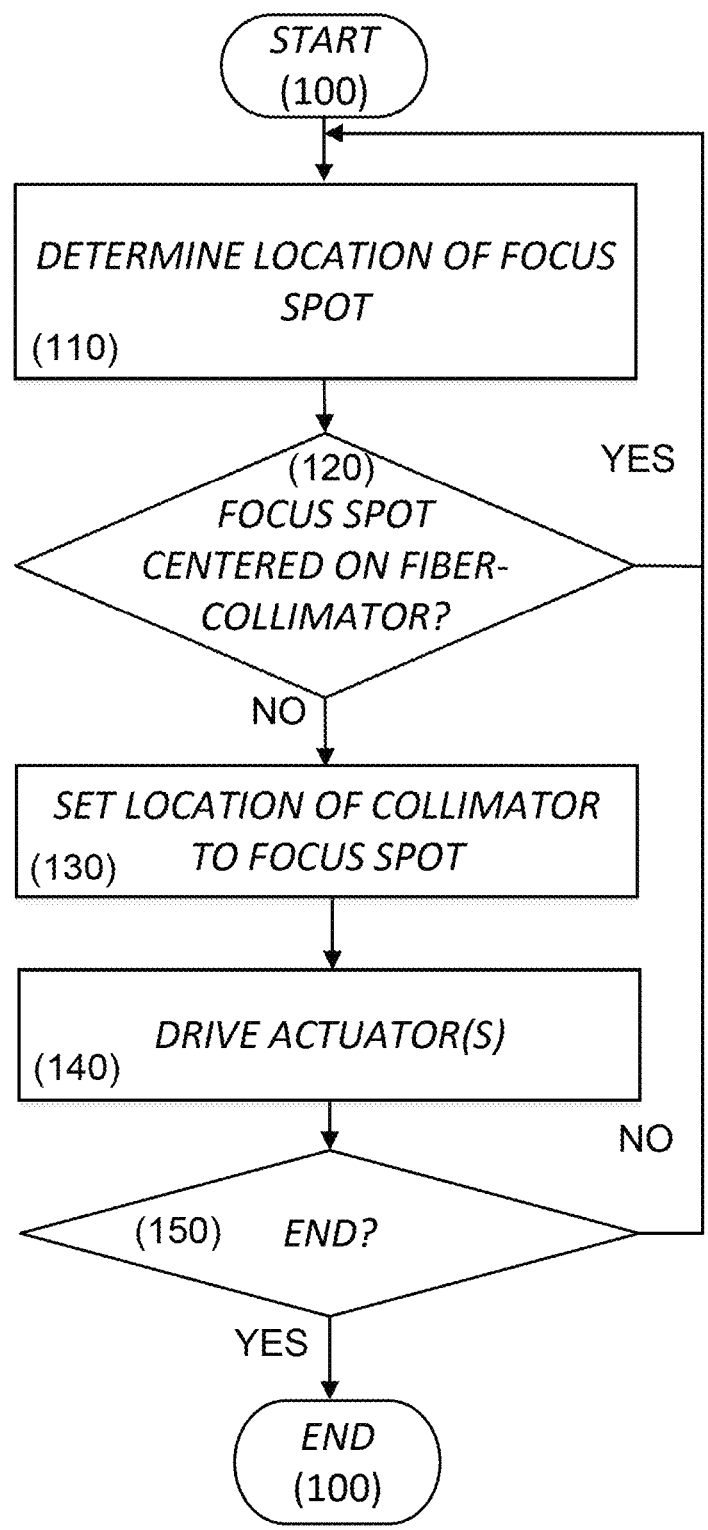
FIG. 11 depicts an embodiment of a methodology that can be carried out by a dynamic concentrator system constructed according to the principles of the disclosure.

FIG. 11 depicts an embodiment of a process IN that can be carried out by a dynamic concentrator system, including, for example, the DCS controller 60 (shown in FIG. 10). Initially, the location of the focus spot 11 can be determined (Step 110). A determination can be made whether the location of the focus spot 11 matches the current real-time location of the fiber collimator 32 (or receiver 30) (Step 120). For instance, the center of the focus spot 11 can be determined and compared to the center of the fiber collimator 32. It is noted that the same process 100 can be carried out with the multicore collimator 32M (or receiver 30).

If it is determined that the locations match (YES at Step 120), then the process can continue to monitor for any changes in focus spot location (Step 110), otherwise (NO at Step 120) a move-to location for the fiber collimator 32 (or receiver 30) can be set to the focus spot location (Step 130) and the actuator(s) driven to move the fiber collimator 32 to the focus spot 11 location (Step 140).

The process 100 can end (YES at Step 150) such as, for example, when dynamic control system is turned off or taken offline, otherwise (NO at Step 150) the process can repeat and continue to monitor and adjust for any changes in location of the focus spot.

The various embodiments discussed above can be mixed and matched as needed.

The terms "a," "an," and "the," as used in this disclosure, means "one or more," unless expressly specified otherwise.

The term "backbone," as used in this disclosure, means a transmission medium that interconnects one or more computing devices to provide a path that conveys data signals and instruction signals between the one or more computing devices. The backbone can include a bus or a network. The backbone can include an ethernet TCP/IP. The backbone can include a distributed backbone, a collapsed backbone, a parallel backbone or a serial backbone.

The term "bus," as used in this disclosure, means any of several types of bus structures that can further interconnect to a memory bus (with or without a memory controller), a peripheral bus, or a local bus using any of a variety of commercially available bus architectures. The term "bus" can include a backbone.

The term "communication link," as used in this disclosure, means a wired or wireless medium that conveys data or information between at least two points. The wired or wireless medium can include, for example, a metallic conductor link, a radio frequency (RF) communication link, an Infrared (IR) communication link, or an optical communication link. The RF communication link can include, for example, WiFi, WiMAX, IEEE 802.11, DECT, 0G, 1G, 2G, 3G, 4G, or 5G cellular standards, or Bluetooth. A communication link can include, for example, an RS-232, RS-422, RS-485, or any other suitable serial interface.

The terms "computer," "computing device," or "processor," as used in this disclosure, means any machine, device, circuit, component, or module, or any system of machines, devices, circuits, components, or modules that are capable of manipulating data according to one or more instructions. The terms "computer," "computing device" or "processor" can include, for example, without limitation, a processor, a microprocessor (µC), a central processing unit (CPU), a graphic processing unit (GPU), an application specific integrated circuit (ASIC), a general purpose computer, a super computer, a personal computer, a laptop computer, a palmtop computer, a notebook computer, a desktop computer, a workstation computer, a server, a server farm, a computer cloud, or an array or system of processors, µCs, CPUs, GPUs, ASICs, general purpose computers, super computers, personal computers, laptop computers, palmtop computers, notebook computers, desktop computers, workstation computers, or servers.

The terms "computing resource" or "computer resource," as used in this disclosure, means software, a software application, a computer application, a computer program, computer code, machine executable instructions, firmware, or a process that can be arranged to execute on a computing device as one or more computing resource processes.

The term "computing resource process," as used in this disclosure, means a computing resource that is in execution or in a state of being executed on an operating system of a computing device. Every computing resource that is created, opened or executed on or by the operating system can create a corresponding "computing resource process." A "computing resource process" can include one or more threads, as will be understood by those skilled in the art.

The term "computer-readable medium," as used in this disclosure, means any non-transitory storage medium that participates in providing data (for example, instructions) that can be read by a computer. Such a medium can take many forms, including non-volatile media and volatile media. Non-volatile media can include, for example, optical or magnetic disks and other persistent memory. Volatile media can include dynamic random-access memory (DRAM). Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

Various forms of computer readable media can be involved in carrying sequences of instructions to a computer. For example, sequences of instruction (i) can be delivered from a RAM to a processor, (ii) can be carried over a wireless transmission medium, or (iii) can be formatted according to numerous formats, standards or protocols, including, for example, WiFi, WiMAX, IEEE 302.11, DECT, 0G, 1G, 2G, 3G, 4G, or 5G cellular standards, or Bluetooth.

The terms "including," "comprising" and their variations, as used in this disclosure, mean "including, but not limited to," unless expressly specified otherwise.

The term "network," as used in this disclosure means, but is not limited to, for example, at least one of a personal area network (PAN), a local area network (LAN), a wireless local area network (WLAN), a campus area network (CAN), a metropolitan area network (MAN), a wide area network (WAN), a metropolitan area network (MAN), a wide area network (WAN), a global area network (GAN), a broadband area network (BAN), a cellular network, a storage-area network (SAN), a system-area network, a passive optical local area network (POLAN), an enterprise private network (EPN), a virtual private network (VPN), the Internet, or the like, or any combination of the foregoing, any of which can be configured to communicate data via a wireless and/or a wired communication medium. These networks can run a variety of protocols, including, but not limited to, for example, Ethernet, IP, IPX, TCP, UDP, SPX, IP, IRC, HTTP, FTP, Telnet, SMTP, DNS, ARP, ICMP.

The term "transmission," "transmit," "sent" or "send," as used in this disclosure, means the conveyance of data, data packets, computer instructions, or any other digital or analog information via electricity, acoustic waves, light waves or other electromagnetic emissions, such as those generated with communications in the radio frequency (RF) or infrared (IR) spectra. Transmission media for such transmissions can include coaxial cables, copper wire and fiber optics, including the wires that comprise a system bus coupled to the processor.

References in the disclosure to "one embodiment," "an embodiment," "an example embodiment," or "example," indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Values expressed in a range format can be interpreted in a flexible manner to include not only the numerical values explicitly recited as the limits of the range, but also to include all the individual numerical values or sub-ranges encompassed within that range as if each numerical value and sub-range is explicitly recited. For example, a concentration range of "about 0.1% to about 5%" can be interpreted to include not only the explicitly recited concentration of about 0.1 wt. % to about 5 wt. %, but also the individual concentrations (for example, 1%, 2%, 3%, and 4%) and the sub-ranges (for example, 0.1% to 0.5%, 1.1% to 2.2%, and 3.3% to 4.4%) within the indicated range. The statement "about X to Y" has the same meaning as "about X to about Y,"" unless indicated otherwise. Likewise, the statement "about X, Y, or about Z" has the same meaning as "about X, about Y, or about Z," unless indicated otherwise.

The term "or" is used to refer to a nonexclusive "or" unless otherwise indicated. Unless indicated otherwise, the statement "at least one of" when referring to a listed group is used to mean one or any combination of two or more of the members of the group. For example, the statement "at least one of A, B, and C" can have the same meaning as "A; B; C; A and B; A and C; B and C; or A, B, and C," or the statement "at least one of D, E, F, and G" can have the same meaning as "D; E; F; G; D and E; D and F; D and G; E and F; E and G; F and G; D, E, and F; D, E, and G; D, F, and G; E, F, and G; or D, E, F, and G." A comma can be used as a delimiter or digit group separator to the left or right of a decimal mark; for example, "0.000,1"" is equivalent to "0.0001."

In the methods described herein, the steps can be carried out in any order without departing from the principles of the invention, except when a temporal or operational sequence is explicitly recited. Furthermore, specified steps can be carried out concurrently unless explicit language recites that they be carried out separately. For example, a recited act of doing X and a recited act of doing Y can be conducted simultaneously within a single operation, and the resulting process will fall within the literal scope of the process. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" can be construed to mean step A is carried out first, step E is carried out last, and steps B, C, and D can be carried out in any sequence between steps A and E (including with one or more steps being performed concurrent with step A or Step E), and that the sequence still falls within the literal scope of the claimed process. A given step or sub-set of steps can also be repeated.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

Devices that are in communication with each other need not be in continuous communication with each other unless expressly specified otherwise. In addition, devices that are in communication with each other may communicate directly or indirectly through one or more intermediaries.

Although process steps, method steps, or algorithms may be described in a sequential or a parallel order, such processes, methods and algorithms may be configured to work in alternate orders. In other words, any sequence or order of steps that may be described in a sequential order does not necessarily indicate a requirement that the steps be performed in that order; some steps may be performed simultaneously. Similarly, if a sequence or order of steps is described in a parallel (or simultaneous) order, such steps can be performed in a sequential order. The steps of the processes, methods or algorithms described in this specification may be performed in any order practical.

When a single device or article is described, it will be readily apparent that more than one device or article may be used in place of a single device or article. Similarly, where more than one device or article is described, it will be readily apparent that a single device or article may be used in place of the more than one device or article. The functionality or the features of a device may be alternatively embodied by one or more other devices which are not explicitly described as having such functionality or features.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, which is defined by the set of recitations in the following claims and by structures and functions or steps which are equivalent to these recitations.

The invention claimed is:

1. A dynamic concentrator system, comprising:
a concentrator lens configured to receive an incoming light at an entrance angle α and concentrate the light beam on a focus spot;
a tracker platform having a detector optical aperture and one or more actuators, the detector optical aperture being configured to receive the concentrated light beam, and the tracker platform being configured to move the detector optical aperture in a spatial plane to a location of the focus spot;
a receiver having a detector optically coupled to the detector optical aperture and configured to receive the concentrated light beam from the detector optical aperture,
wherein the detector optical aperture comprises a fiber collimator,
wherein the tracker platform is configured to move the fiber collimator to the location of the focus spot,
wherein the receiver comprises a fiberoptic line configured to optically couple the fiber collimator to the detector, and
wherein:
the detector comprises a plurality of detectors;
the fiberoptic line comprises a multicore fiber optically coupled at one end to the plurality of detectors; and
the fiber collimator comprises a multicore collimator optically coupled to another end of the multicore fiber, wherein when the focus spot is centered on a center fiber of the fiber collimator, the focus spot partially overlaps a plurality of fibers disposed around the center fiber.

2. A dynamic concentrator system, comprising:
a concentrator lens configured to receive an incoming light at an entrance angle α and concentrate the light beam on a focus spot;
a tracker platform having a detector optical aperture and one or more actuators, the detector optical aperture being configured to receive the concentrated light beam and a pair of actuators being configured to move the detector optical aperture in a spatial plane to a location of the focus spot; and
a receiver having a detector optically coupled to the detector optical aperture and configured to receive the concentrated light beam from the detector optical aperture,
wherein the detector optical aperture comprises a fiber collimator,
wherein the tracker platform comprises a plurality of guide rods, a plurality of guides and a pair of drive sleeves configured to move the fiber collimator to the location of the focus spot,
wherein the receiver comprises a fiberoptic line configured to optically couple the fiber collimator to the detector, and
wherein:
the detector comprises a plurality of detectors, each comprising an Indium Gallium Arsenide (InGaAs) Avalanche Photodiode (APD) detector;
the fiberoptic line comprises a multicore fiber optically coupled at one end to the plurality of detectors; and
the fiber collimator comprises a multicore collimator optically coupled to another end of the multicore fiber, wherein when the focus spot is centered on a center fiber of the fiber collimator, the focus spot partially overlaps a plurality of fibers disposed around the center fiber.

3. The dynamic concentrator system in claim 1, wherein the tracker platform comprises a tracking stage, and wherein the detector optical aperture is affixed to the tracking stage.

4. The dynamic concentrator system in claim 3, wherein the tracker platform comprises at least one guide rod, at least one guide and at least one drive sleeve, the at least one drive sleeve being connected directly or indirectly to the tracking stage at an end and an actuator at another end.

5. The dynamic concentrator system in claim 1, wherein the fiber collimator is affixed to an end of the fiberoptic line.

6. The dynamic concentrator system in claim 1, wherein the fiber collimator is a bare end of the fiberoptic line.

7. A dynamic concentrator system, comprising:
a concentrator lens configured to receive an incoming light at an entrance angle α and concentrate the light beam on a focus spot;
a tracker platform having a detector optical aperture and one or more actuators, the detector optical aperture being configured to receive the concentrated light beam and the one or more actuators being configured to move the detector optical aperture to a center location of the focus spot; and
a receiver having a detector optically coupled to the detector optical aperture and configured to receive the concentrated light beam from the detector optical aperture,
wherein the receiver comprises a fiberoptic line configured to optically couple a fiber collimator to the detector,
wherein the detector comprises a plurality of detectors,
wherein the fiberoptic line comprises a multicore fiber optically coupled at one end to the plurality of detectors; and
wherein another end of the multicore fiber is configured to be optically coupled to the fiber collimator, wherein when the focus spot is centered on a center fiber of the fiber collimator, the focus spot partially overlaps a plurality of fibers disposed around the center fiber.

8. The dynamic concentrator system in claim 7, wherein the detector optical aperture comprises the fiber collimator.

9. The dynamic concentrator system in claim 7, wherein each of the plurality of detectors comprises an Indium Gallium Arsenide (InGaAs) Avalanche Photodiode (APD) detector.

10. The dynamic concentrator system in claim 7, wherein the tracker platform comprises a tracking stage, and wherein the detector optical aperture is affixed to the tracking stage.

11. The dynamic concentrator system in claim 10, wherein the tracker platform comprises a guide rod and a drive sleeve configured to travel along a portion of a length of the guide rod, and wherein the drive sleeve is connected directly or indirectly to the tracking stage and configured to engage one of the one or more actuators to move the tracking stage along a first axis.

12. The dynamic concentrator system in claim 11, wherein the tracker platform comprises a second guide rod and a second drive sleeve configured to travel along a portion of a length of the second guide rod, and wherein the second drive sleeve is connected directly or indirectly to the tracking sage and configured to engage another one of the one or more actuators to move the tracking stage along a second axis that is orthogonal to the first axis.

13. The dynamic concentrator system in claim 11, wherein the drive sleeve is connected to the tracking stage by a stage arm.

14. The dynamic concentrator system in claim 7, wherein the one or more actuators comprises an electromagnetic coil.

15. The dynamic concentrator system in claim 7, wherein the one or more actuators comprises a charged plate.

16. A dynamic concentrator system, comprising:
a tracker platform equipped with a detector optical aperture and one or more actuators, the detector optical aperture being configured to receive a concentrated light beam from a concentration lens system and the one or more actuators, the tracker platform being configured to move the detector optical aperture to a location corresponding to a focus spot of the concentrated light beam;
a receiver having a detector optically coupled to the detector optical aperture and configured to receive the concentrated light beam from the detector optical aperture; and
a controller configured to determine a position of the focus spot and drive the one or more actuators to move the detector optical aperture to the position of the focus spot,
wherein the receiver comprises a fiberoptic line configured to optically couple a fiber collimator to the detector,
wherein the detector comprises a plurality of detectors,
wherein the fiberoptic line comprises a multicore fiber optically coupled at one end to the plurality of detectors; and
wherein another end of the multicore fiber is configured to be optically coupled to the fiber collimator, wherein when the focus spot is centered on a center fiber of the fiber collimator, the focus spot partially overlaps a plurality of fibers disposed around the center fiber.

17. The dynamic concentrator system in claim 16, wherein the detector optical aperture comprises a fiber collimator.

18. The dynamic concentrator system in claim 16, wherein the receiver includes a fiberoptic line connected between and arranged to optically couple the detector optical aperture to the detector.

19. The dynamic concentrator system in claim 16, wherein the detector comprises an Indium Gallium Arsenide (InGaAs) Avalanche Photodiode (APD) detector.

* * * * *